United States Patent
Chen et al.

(10) Patent No.: US 9,756,721 B2
(45) Date of Patent: Sep. 5, 2017

(54) MULTILAYER LAMINATED SUBSTRATE STRUCTURE

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Jia-Liang Chen, Kaohsiung (TW); Ting-Ju Lin, Yilan County (TW); Ling-Chih Chou, New Taipei (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/096,257

(22) Filed: Apr. 11, 2016

(65) Prior Publication Data
US 2017/0188452 A1 Jun. 29, 2017

(30) Foreign Application Priority Data
Dec. 23, 2015 (CN) .......................... 2015 1 0979103

(51) Int. Cl.
*H05K 1/02* (2006.01)
*H05K 1/11* (2006.01)

(52) U.S. Cl.
CPC ......... *H05K 1/0251* (2013.01); *H05K 1/0215* (2013.01); *H05K 1/0298* (2013.01); *H05K 1/114* (2013.01)

(58) Field of Classification Search
CPC .... H05K 1/0251; H05K 1/0298; H05K 1/114; H05K 1/0215
USPC ......................................................... 174/261
See application file for complete search history.

(56) References Cited

U.S. PATENT DOCUMENTS

| | | | |
|---|---|---|---|
| 5,659,953 A | 8/1997 | Crane, Jr. et al. | |
| 6,337,037 B1 | 1/2002 | St. John | |
| 7,897,880 B1 * | 3/2011 | Goergen | H05K 1/0237 174/261 |
| 9,264,010 B2 * | 2/2016 | Lee | H03H 7/17 |
| 2016/0064415 A1 * | 3/2016 | Zhan | H01L 27/124 257/72 |

FOREIGN PATENT DOCUMENTS

| CN | 1993017 A | 7/2007 |
|---|---|---|
| TW | 454277 B | 9/2001 |

* cited by examiner

*Primary Examiner* — Timothy Thompson
*Assistant Examiner* — Charles Pizzuto
(74) *Attorney, Agent, or Firm* — CKC Partners Co., Ltd.

(57) ABSTRACT

A multilayer laminated substrate structure includes plural substrate layers stacked with each other, and a conductive via portion. One of the substrate layers is provided with a through hole. The conductive via portion includes a first signal conductive pad having a first rib, a second signal conductive pad having a second rib, and a conductive body which is disposed in the through hole and is electrically connected to the first rib and the second rib. The first signal conductive pad and the second signal conductive pad are disposed on two opposite surfaces of the substrate layer, and the first rib and the second rib are arranged in a staggered manner in relation to each other.

17 Claims, 12 Drawing Sheets

MULTILAYER LAMINATED SUBSTRATE STRUCTURE

RELATED APPLICATIONS

This application claims priority to China Application Serial Number 201510979103.1, filed Dec. 23, 2015, which is herein incorporated by reference.

BACKGROUND

Field of Disclosure

The present disclosure relates to a multilayer laminated substrate structure. More particularly, the present disclosure relates to a multilayer laminated substrate structure with a conductive via portion thereon.

Description of Related Art

A conventional multilayer laminated substrate structure is formed by stacking plural substrates. Each of the substrates is provided with a patterning circuit layer and signal via portions formed thereon. The patterning circuit layers of the substrates of the multilayer laminated substrate structure are electrically connected with each other through their respective signal via portions. Each of the patterning circuit layers is electrically connected to other electric elements of the same substrate through a signal conductive pad of one end of the signal via portion.

However, based on principle of electricity, when an effective distance is formed between the signal conductive pads at two opposite ends of each of the signal via portions, parasitic capacitance effect would be resulted in and thus the impedance value, transmission speed and filtering performance of the traditional multilayer laminated substrate structure are reduced.

Therefore, ways to provide a solution to effectively solve the aforementioned inconvenience and shortcomings and to increase the competitiveness of industries will be seriously concerned.

SUMMARY

An aspect of the disclosure is to provide a multilayer laminated substrate structure to overcome the defects and inconvenience of the prior art.

According to one embodiment, the multilayer laminated substrate structure includes a first substrate layer, a second substrate layer and a first conductive via portion. The first substrate layer is provided with a first through hole penetrating through the first substrate layer. The second substrate layer is stacked on the first substrate layer. The first conductive via portion includes a first signal conductive pad, a second signal conductive pad and a first conductive body. The first signal conductive pad is formed on one surface of the first substrate layer, and includes at least one first rib. The second signal conductive pad is formed on the other surface of the first substrate layer, and includes at least one second rib. The first conductive body is disposed in the first through hole, and respectively connected to the first rib and the second rib. The first rib and the second rib are arranged in a staggered manner in relation to each other.

Since the first rib and the second rib are arranged in a staggered manner in relation to each other, in the multilayer laminated substrate structure of the embodiment, the possibility of parasitic capacitance effect caused between the first signal conductive pad and the second signal conductive pad of the first conductive via portion can be reduced, so as to avoid decreasing the impedance value, transmission speed and filtering performance of the multilayer laminated substrate structure, and to maintain the electricity performance of the first conductive via portion. Also, the multilayer laminated substrate structure of the embodiment reduces the discontinuities of impedance by increasing the impedance value of the signal conductive pad of the first conductive via portion.

In one or more embodiments of the present disclosure, the second substrate layer has a second through hole, wherein the second signal conductive pad is connected to one surface of the second substrate layer, and is arranged between the first substrate layer and the second substrate layer, and the multilayer laminated substrate structure further includes a second conductive via portion, in which the second conductive via portion is disposed in the second through hole, and the second conductive via portion includes a third signal conductive pad and a second conductive body. The third signal conductive pad is formed on the other surface of the second substrate layer, and the third signal conductive pad includes at least one third rib. The second conductive body is disposed in the second through hole, and the second conductive body is respectively connected to the second rib and the third rib, and the second conductive body is coaxial with a longitudinal axis of the first conductive body. An orthographic projection of the third rib onto the first substrate layer and an orthographic projection of the second rib onto the first substrate layer are arranged in a staggered manner in relation to each other.

According to one embodiment, the multilayer laminated substrate structure includes plural substrate layers and a conductive via portion. The substrate layers are stacked with each other. The conductive via portion penetrates through one of the substrate layers, and the conductive via portion includes a first radiating pattern and a second radiating pattern. The first radiating pattern is formed on one surface of the substrate layer, and the first radiating pattern has plural first ribs which are radially arranged. The second radiating pattern is formed on the other surface of the substrate layer, and the second radiating pattern has plural second ribs which are radially arranged. An orthographic projection of the second rib to another of the substrate layers and an orthographic projection of the first rib to another of the substrate layers are arranged in a staggered manner in relation to each other.

According to one embodiment, the multilayer laminated substrate structure includes plural substrate layers, a first conductive via portion and a third conductive via portion. The substrate layers are stacked with each other. The first conductive via portion penetrates through one of the substrate layers, and the first conductive via portion includes a first radiating pattern formed on one surface of the substrate layer, and the first radiating pattern has plural first ribs which are radially arranged. The third conductive via portion penetrates through the substrate layer in which the first conductive via portion is disposed. The third conductive via portion and the first conductive via portion are adjacent and arranged abreast. The third radiating pattern has plural third ribs which are radially arranged. A longitudinal axis of one of the first ribs passes through a gap formed between two neighboring ones of the third ribs.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

First Embodiment

Figure 1:
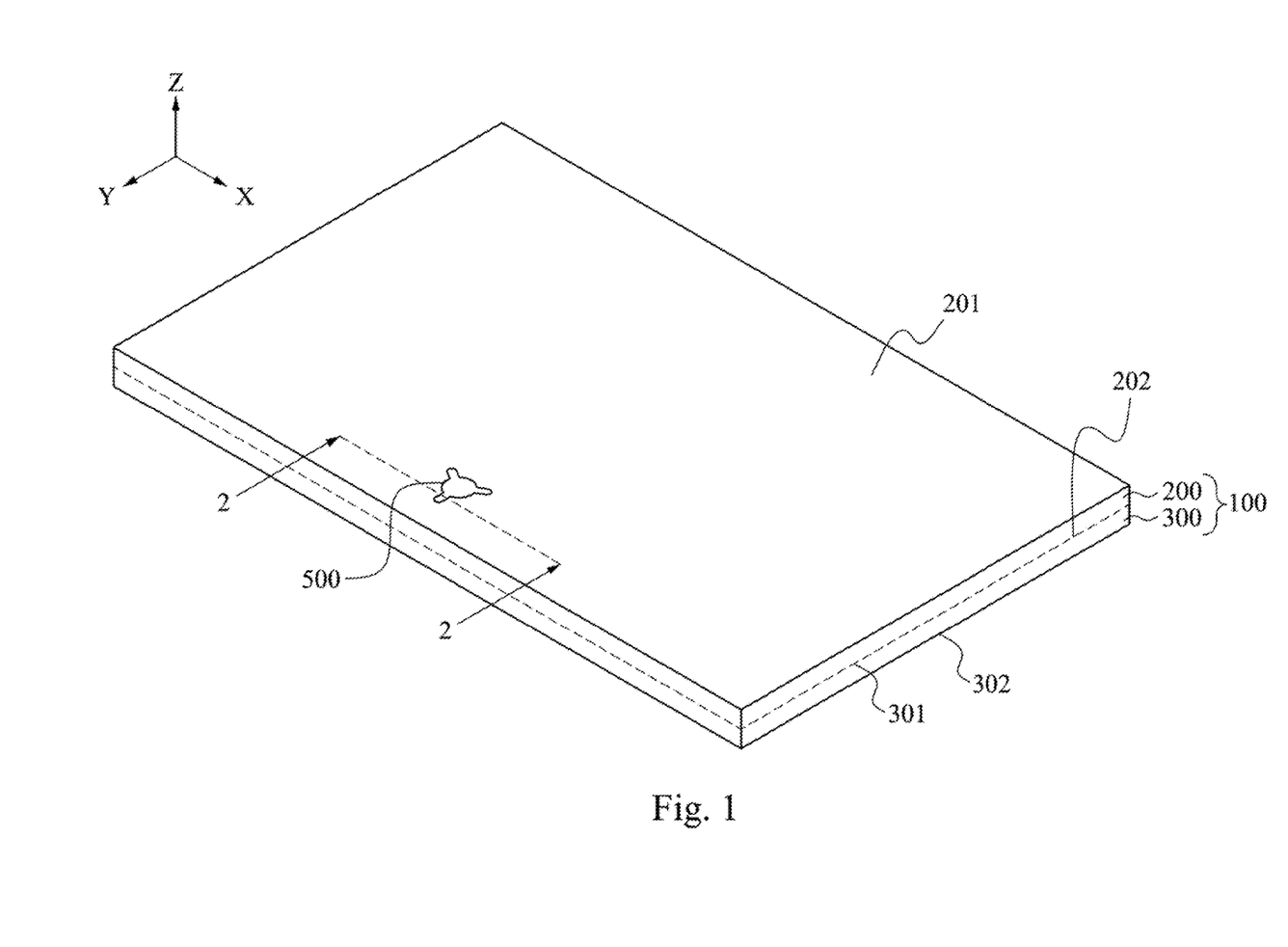
FIG. 1 is a schematic view of a multilayer laminated substrate structure according to a first embodiment of the disclosure.
Figure 2:
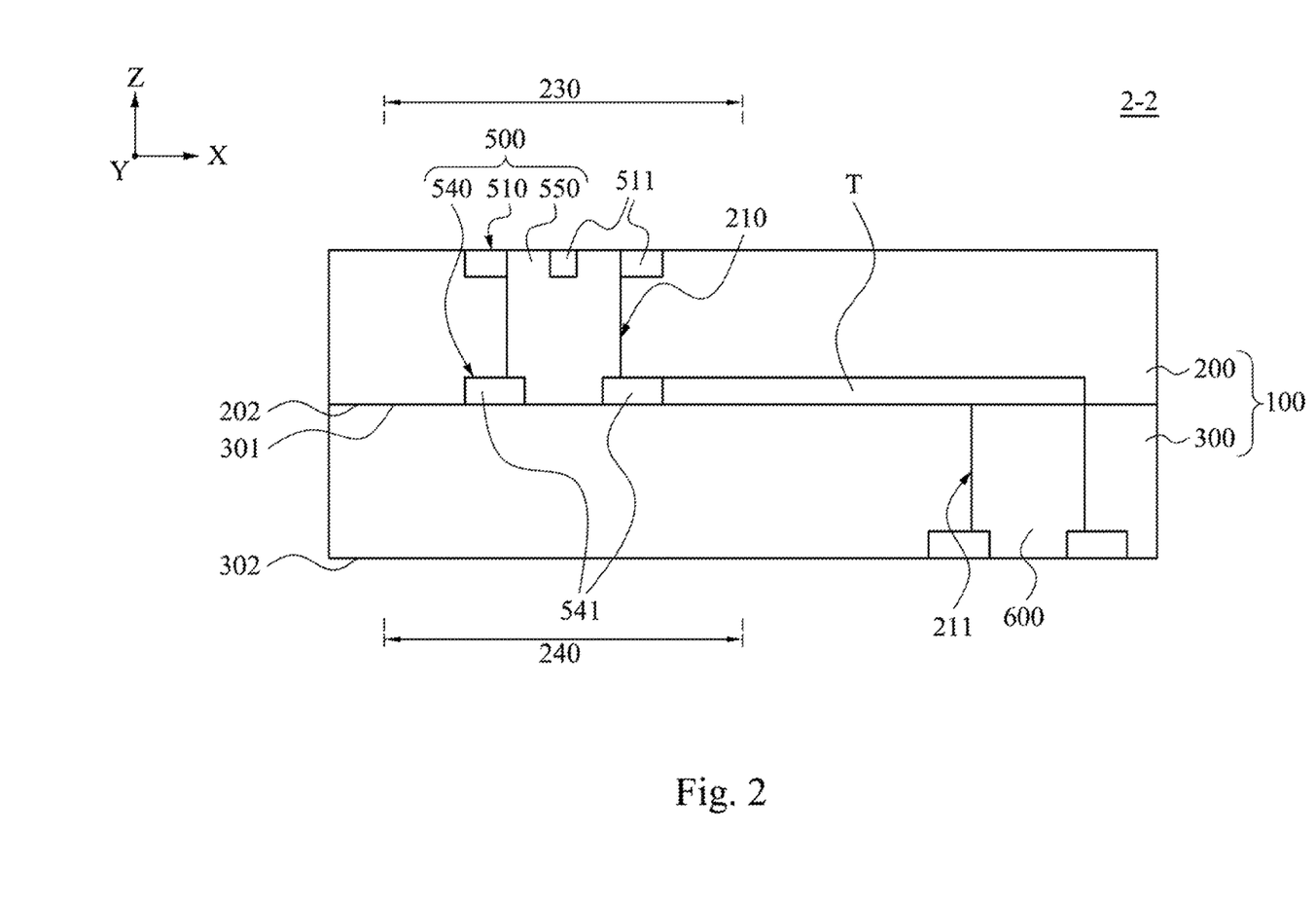
FIG. 2 is a cross-sectional view of the multilayer laminated substrate structure viewed along line 2-2 of FIG. 1.

Reference is now made to FIG. 1 and FIG. 2, in which FIG. 1 is a schematic view of a multilayer laminated substrate structure 100 according to a first embodiment of the disclosure, and FIG. 2 is a cross-sectional view of the multilayer laminated substrate structure viewed along line 2-2 of FIG. 1. The multilayer laminated substrate structure 100 includes a first substrate layer 200, a second substrate layer 300, a first conductive via portion 500 and a second conductive via portion 600. The first substrate layer 200 is provided with a first through hole 210, a first surface 201, and a second surface 202 opposite to the first surface 201. The first through hole 210 penetrates through the first substrate layer 200 in a vertical direction thereof and connects the first surface 201 and the second surface 202. The first conductive via portion 500 is disposed in the first through hole 210. The second substrate layer 300 is provided with a second through hole 211, a third surface 301, and a fourth surface 302 opposite to the third surface 301. The second through hole 211 penetrates through the second substrate layer 300 in the vertical direction thereof and connects the third surface 301 and the fourth surface 302. The second conductive via portion 600 is disposed in the second through hole 211, and the second conductive via portion 600 is non-coaxial with the first conductive via portion 500. The second conductive via portion 600 is electrically connected to the first conductive via portion 500 through a patterning circuit T formed on the second surface 202 of the first substrate layer 200. The second substrate layer 300 is stacked on the first substrate layer 200 so that the second surface 202 of the first substrate layer 200 is connected to the third surface 301 of the second substrate layer 300.

Figure 3A:
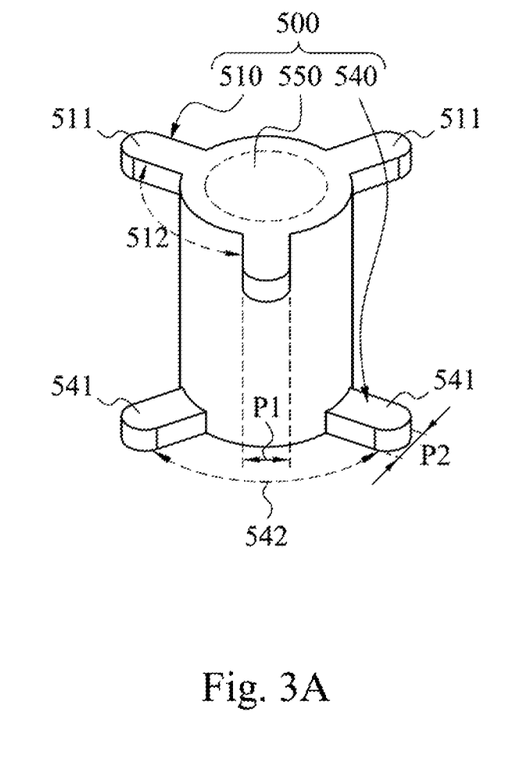
FIG. 3A is a perspective view of a first conductive via portion according to the first embodiment of the disclosure.
Figure 3B:
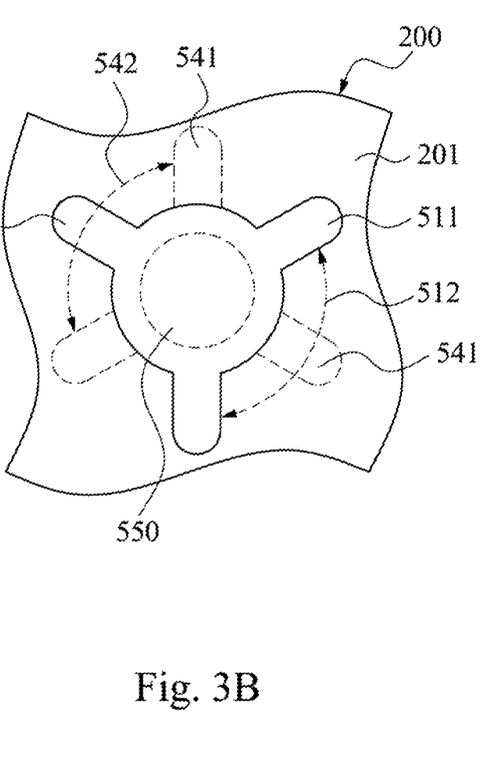
FIG. 3B is top view of FIG. 3A.

FIG. 3A is a perspective view of a first conductive via portion 500 according to the first embodiment of the disclosure, and FIG. 3B is top view of FIG. 3A. As shown in FIG. 2 and FIG. 3A, the first conductive via portion 500 includes a first signal conductive pad 510, a second signal conductive pad 540 and a first conductive body 550. The first signal conductive pad 510 is formed on the first surface 201 of the first substrate layer 200. The second signal conductive pad 540 is formed on the second surface 202 of the first substrate layer 200, and is disposed between the first substrate layer 200 and the second substrate layer 300. The first signal conductive pad 510 includes plural first ribs 511, and the shapes and the sizes of the first ribs 511 are the same. The second signal conductive pad 540 includes plural second ribs 541, and the shapes and the sizes of the second ribs 541 are the same. The first conductive body 550 is disposed in the first through hole 210, and is respectively connected to the first ribs 511 and the second ribs 541. The first ribs 511 and the second ribs 541 disposed on two opposite ends of the first conductive body 550 respectively extend radially outwardly. However, the shapes and the sizes of the first ribs (or the second ribs) do not have to be the same in the disclosure.

It is noted, as shown in FIG. 3A and FIG. 3B, the first ribs 511 and the second ribs 541 are arranged in a staggered manner in relation to each other, and the first ribs 511 and the second ribs 541 are not overlapped with each other vertically (in the same Z axis). For example, the first ribs 511 and the second ribs 541 are arranged in a staggered manner in relation to each other, an orthographic projection P1 of each of the first ribs 511 which is projected onto one plane and an orthographic projection P2 of each of the second ribs 541 which is projected onto the same plane are arranged in a staggered manner in relation to each other. Namely, each of the second ribs 541 shown in FIG. 3B is in any two neighboring ones of the first ribs 511. For example, the orthographic projection P2 of each of the second ribs 541 which is projected onto the same plane of the first ribs 511 is in any two neighboring ones of the first ribs 511.

Therefore, since the second ribs 541 and the first ribs 511 of the first conductive via portion 500 are arranged in a staggered manner in relation to each other, and are not vertically (in the same Z axis) aligned exactly with each other, and thus the shortest distance between the first rib 511 and the second rib 541 is increased so that the possibility of the parasitic capacitance effect between the first rib 511 and the second rib 541 can be reduced. Therefore, in the embodiment, the multilayer laminated substrate structure is able to avoid decreasing the impedance value, transmission speed and filtering performance thereof, and is able to maintain the electricity performance of the first conductive via portion.

Specifically, referring to FIG. 2 again, in this embodiment, the first conductive body 550 fully fills in the first through hole 210. The first signal conductive pad 510 is embedded in the first surface 201 of the first substrate layer 200 so that the surface of the first signal conductive pad 510 is coplanar with the first surface 201 of the first substrate layer 200. The second signal conductive pad 540 is embedded in the second surface 202 of the first substrate layer 200 so that the surface of the second signal conductive pad 540 is coplanar with the second surface 202 of the first substrate layer 200. However, the disclosure is not limited thereto.

Furthermore, as shown in FIG. 3B, since the first ribs 511 and the second ribs 541 are respectively radially arranged, the first conductive body 550 and the first ribs 511 are mutually formed in a radial pattern, and the first conductive body 550 and the second ribs 541 are mutually formed in another radial pattern. Thus, since the parasitic capacitance is proportional to the total area of each of the signal conductive pads 510 and 540, when the conventional signal conductive pad is modified to the signal conductive pad having the radial pattern for decreasing the total area of the traditional signal conductive pad, the parasitic capacitance thereof can be reduced.

More particularly, in this embodiment, the first ribs 511 and the second ribs 541 are the same in number (e.g., three). For example, three first ribs 511 are separated to radially and equidistantly surround the first conductive body 550, and three second ribs 541 are separated to radially and equidistantly surround the first conductive body 550. Thus, an included angle defined between any two neighboring ones of the first ribs 511 is 120°, and an included angle defined between any two neighboring ones of the second ribs 541 is 120'. Also, a first gap 512 is formed between any two neighboring ones of the first ribs 511, and a second gap 542 is formed between any two neighboring ones of the second ribs 541, and each of the first gaps 512 and each of the second gaps 542 are the same in size.

However, the disclosure is not limited to any specific numbers, included angles and gap widths of the first ribs or the second ribs, the person having ordinary skill in the art may flexibly select a proper number, a proper included angle and a proper gap width for forming the first ribs or the second ribs according to actual requirements.

Figure 4:
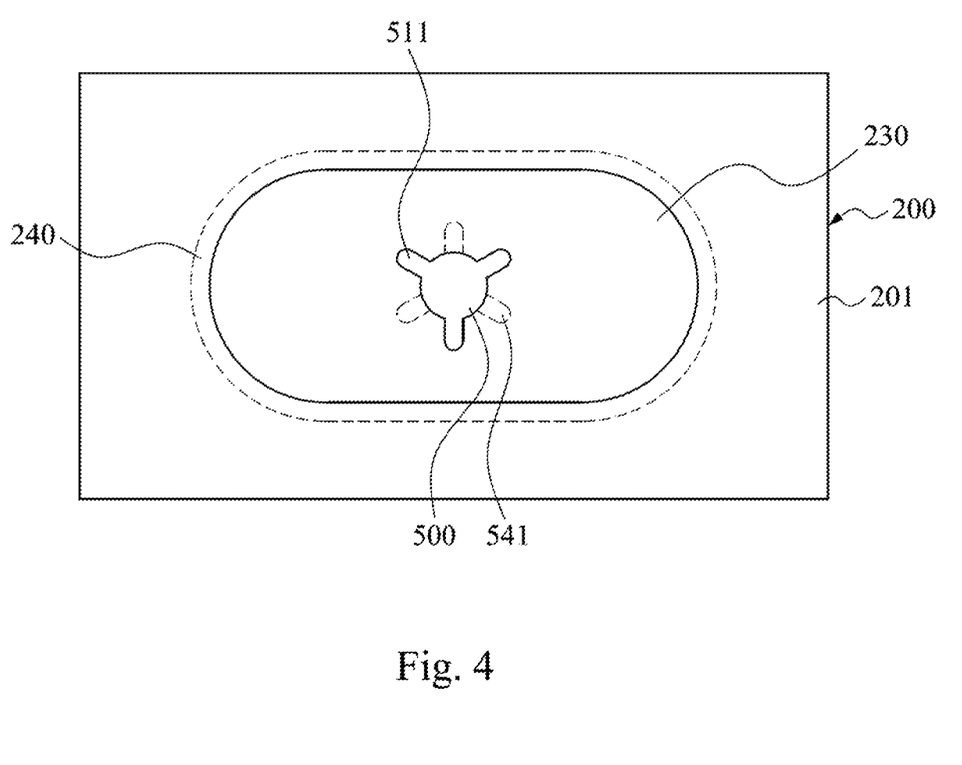
FIG. 4 is a schematic view of the first conductive via portion and the first substrate layer.

FIG. 4 is a schematic view of the first conductive via portion 500 and the first substrate layer 200. As shown in FIG. 2 and FIG. 4, the first substrate layer 200 is further provided with a first grounding zone 230 and a second grounding zone 240. The first grounding zone 230 is formed on the first surface 201 of the first substrate layer 200. The second grounding zone 240 is formed on the second surface 202 of the first substrate layer 200. The first through hole 210 is located at the first grounding zone 230 and the second grounding zone 240, and the first conductive via portion 500 is electrically connected to the first grounding zone 230 and the second grounding zone 240. Therefore, noises of the multilayer laminated substrate structure 100 can be transmitted to the first grounding zone 230 or the second grounding zone 240 through the first conductive via portion 500 so as to maintain the electricity performance of the multilayer laminated substrate structure 100.

Second Embodiment

Figure 5:
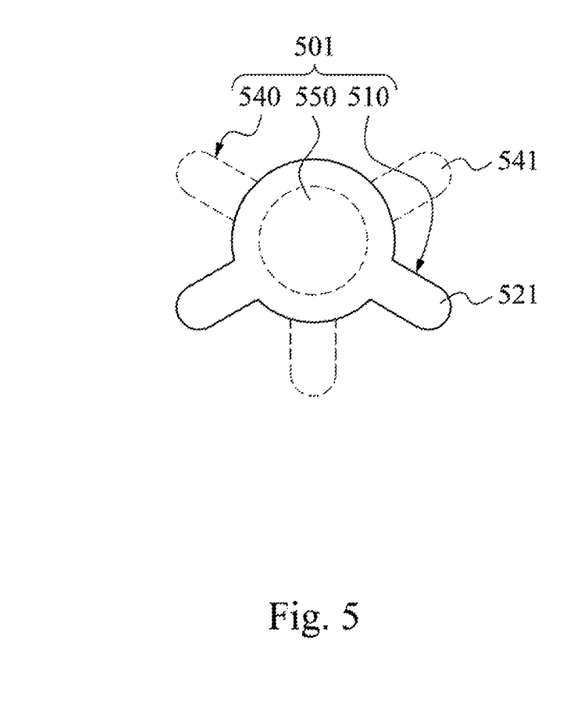
FIG. 5 is a top view of the first conductive via portion of the multilayer laminated substrate structure according to the second embodiment of the disclosure.

FIG. 5 is a top view of the first conductive via portion 501 of the multilayer laminated substrate structure according to the second embodiment of the disclosure. As shown in FIG. 5, the multilayer laminated substrate structure of the second embodiment is substantially the same as the multilayer laminated substrate structure of the first embodiment, except that the first ribs 521 and the second ribs 541 are not the same in number. For example, the number of the first ribs 521 are two, and the number of the second ribs 541 are three. Thus, the possibility of the first ribs 521 and the second ribs 541 being mutually overlapped to result in the parasitic capacitance effect can be further avoided However, the disclosure is not limited to any specific numbers of the first ribs and the second ribs, the person having ordinary skill in the art may flexibly select a proper number for forming the first ribs and the second ribs according to actual requirements.

Third Embodiment

Figure 6:
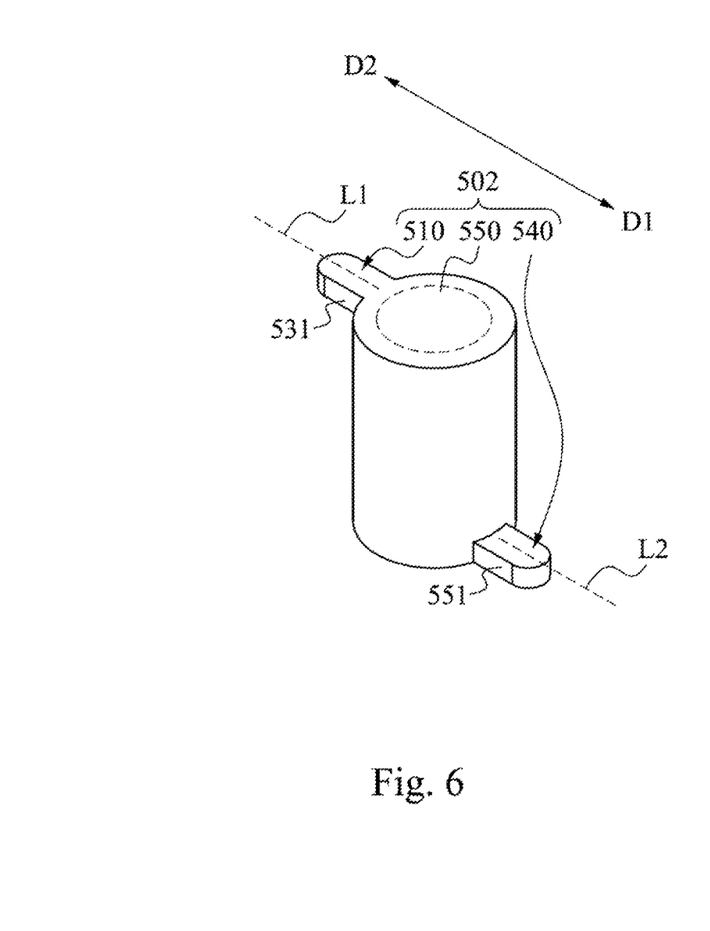
FIG. 6 is a perspective view of a first conductive via portion according to the third embodiment of the disclosure.

FIG. 6 is a perspective view of a first conductive via portion according to the third embodiment of the disclosure. As shown in FIG. 6, the multilayer laminated substrate structure of the third embodiment is substantially the same as the multilayer laminated substrate structure of the first embodiment, except that the number of the first rib and the number of the second rib are one. In the embodiment, the first rib 531 and the second rib 551 respectively extend in two opposite directions D1, D2, that is, a longitudinal axis L1 of the first rib 531 is parallel to a longitudinal axis L2 of the second rib 551.

Since the first rib 531 and the second rib 551 respectively extend in the opposite directions D1 and D2, the possibility of the parasitic capacitance effect caused between the first rib 531 and the second rib 551 can be further avoided completely.

Fourth Embodiment

Figure 7:
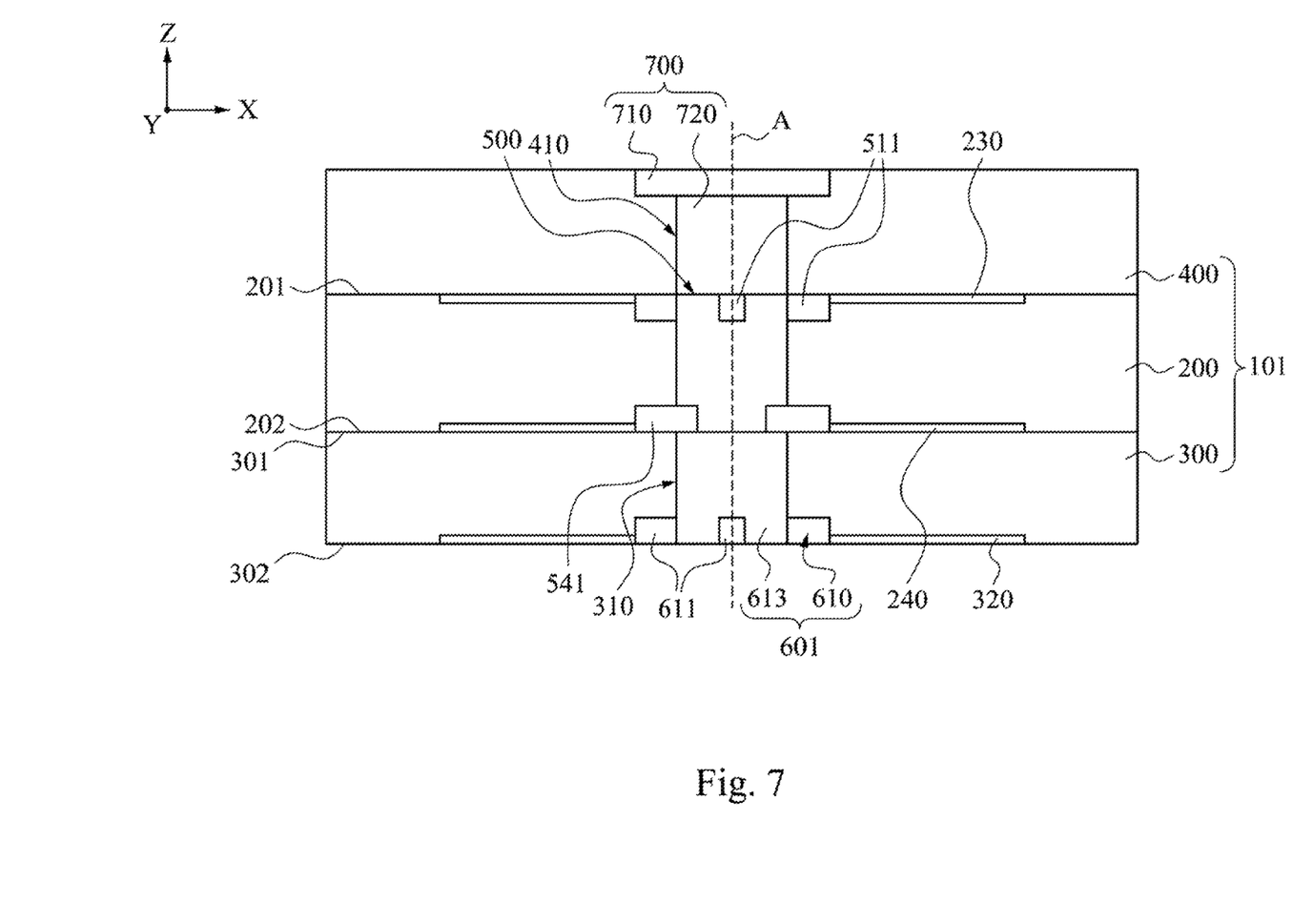
FIG. 7 is a cross-sectional view of a multilayer laminated substrate structure according to a fourth embodiment of this disclosure in which the cutting position of FIG. 7 is the same as the cutting position of FIG. 2.
Figure 8:
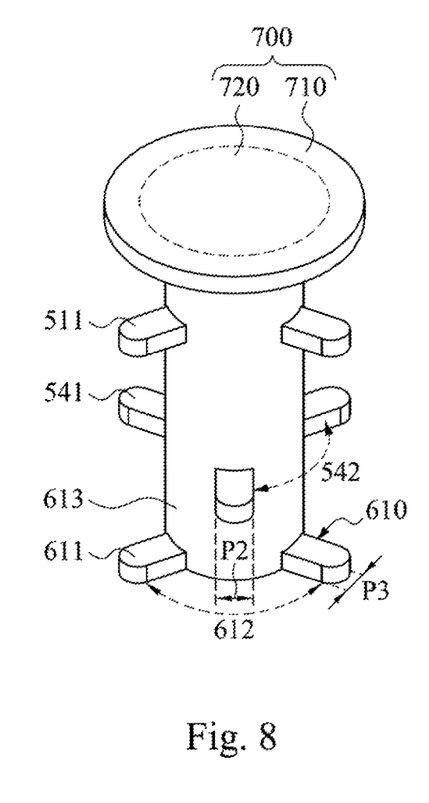
FIG. 8 is a perspective view of the first conductive via portion and the second conductive via portion according to the fourth embodiment of the disclosure.

FIG. 7 is a cross-sectional view of a multilayer laminated substrate structure 101 according to a fourth embodiment of this disclosure in which the cutting position of FIG. 7 is the same as the cutting position of FIG. 2. FIG. 8 is a perspective view of the first conductive via portion 500 and the second conductive via portion 601 according to the fourth embodiment of the disclosure. As shown in FIG. 7 and FIG. 8, the multilayer laminated substrate structure 101 of the fourth embodiment is substantially the same as the multilayer laminated substrate structure 100 of the first embodiment, except that the multilayer laminated substrate structure 101 is provided with an outermost substrate layer 400 in which the first substrate layer 200 is sandwiched between the second substrate layer 300 and the outermost substrate layer 400, and the outermost substrate layer 400 contacts the first surface 201 of the first substrate layer 200. Thus, the first substrate layer 200 is an intermediate layer of the multilayer laminated substrate structure 101.

The second substrate layer 300 is provided with a second through hole 310. The second through hole 310 penetrates through the second substrate layer 300 in a vertical direction thereof and connects the third surface 301 and the fourth surface 302. The second conductive via portion 601 is disposed in the second through hole 310. The second conductive via portion 601 is coaxial with a longitudinal axis (i.e., a dotted line A) of the first conductive via portion 500, and the second conductive via portion 601 and the first conductive via portion 500 are connected with each other. Furthermore, the second conductive via portion 601 includes a third signal conductive pad 610 and a second conductive body 613. The third signal conductive pad 610 is formed on the fourth surface 302 of the second substrate layer 300. The third signal conductive pad 610 includes plural third ribs 611. The second conductive body 613 is disposed in the second through hole 310, and is coaxial with a longitudinal axis (i.e., dotted line A) of the first conductive body 550. The second ribs 541 are connected to both of the second conductive body 613 and the first conductive body 550, and the second ribs 541 are respectively extend radially outwardly. The third ribs 611 disposed on the other end of the second conductive body 613 being opposite to the second ribs 541 extend radially outwardly.

It is noted that, the second ribs 541 and the third ribs 611 are arranged in a staggered manner in relation to each other, and the second ribs 541 and the third ribs 611 are not overlapped with each other vertically (in the same Z axis). For example, an orthographic projection P2 of each of the second ribs 541 which is projected onto one plane and an orthographic projection P3 of each of the third ribs 611 which is projected onto the same plane are arranged in a staggered manner in relation to each other. In other words, as shown in FIG. 8, each of the second ribs 541 is exposed between two of the third ribs 611, and each of the third ribs 611 is exposed between two of the second ribs 541. Thus, since the third ribs 611 and the second ribs 541 are arranged in a staggered manner in relation to each other, a shortest distance between the third rib 611 and the second rib 541 is increased so that the possibility of the parasitic capacitance effect between the third rib 611 and the second rib 541 can be reduced.

Besides, in the embodiment, although the first ribs 511 the third ribs 611 are overlapped with each other, however, since the distance between the first ribs 511 and the third ribs 611 is greater than the distance between the first ribs 511 and the second ribs 541, the possibility of the parasitic capacitance effect between the first rib 511 and the third rib 611 can be reduced. However, the disclosure is not limited thereto. In other embodiments, the first ribs, the second ribs and the third ribs still may be arranged cooperatively in a staggered manner in relation to each other.

In specific details, the second conductive body 613 fully fills the second through hole 310. The third signal conductive pad 610 is embedded in the fourth surface 302 of the second substrate layer 300 so that the surface of the third signal conductive pad 610 is coplanar with the fourth surface 302 of the second substrate layer 300. However, the disclosure is not limited thereto.

Furthermore, as shown in FIG. 8, since the third ribs 611 are respectively radially arranged, the second conductive body 613 and the third ribs 611 are mutually formed in a radial pattern. Thus, since the parasitic capacitance is proportional to the total area of the signal conductive pad, when the conventional signal conductive pad is modified to the signal conductive pad having the radial pattern for decreasing the total area of the traditional signal conductive pad, the parasitic capacitance thereof can be reduced.

More particularly, in this embodiment, the third ribs 611 and the second ribs 541 are the same in number (e.g., three). For example, three third ribs 611 are separated to radially and equidistantly surround the second conductive body 613, and three second ribs 541 are separated to radially and equidistantly surround the second conductive body 613. Thus, an included angle defined between any two neighboring ones of the third ribs 611 is 120', and an included angle defined between any two neighboring ones of the second ribs 541 is 120° as well. Also, a third gap 612 is formed between any two neighboring ones of the third ribs 611, and a second gap 542 is formed between any two neighboring ones of the second ribs 541, and each of the third gaps 612 and each of the second gaps 542 are the same in size.

However, the disclosure is not limited thereto. In other embodiments, the number of the third rib and the number of the second rib are one, and a longitudinal axis of the single third rib is parallel to a longitudinal axis of the single second rib. Alternatively, the third rib and the second rib do not have to be the same in number. The person having ordinary skill in the art may flexibly select a proper number, a proper included angle and a proper gap size for forming the first ribs to the third ribs according to actual requirements.

As shown in FIG. 7, the second substrate layer 300 is further provided with a third grounding zone 320. The third grounding zone 320 is formed on the fourth surface 302 of the second substrate layer 300. The second through hole 310 is located at the third grounding zone 320 and the second grounding zone 240, and the second conductive via portion 601 is electrically connected to the third grounding zone 320 and the second grounding zone 240. Therefore, noises of the multilayer laminated substrate structure 101 can be transmitted to the first grounding zone 230, the second grounding zone 240 and the third grounding zone 320 through the first conductive via portion 500 and the second conductive via portion 601, so as to maintain the electricity performance of the multilayer laminated substrate structure 101.

Furthermore, the outermost substrate layer 400 is further provided with a penetrating hole 410 and an outermost conductive via portion 700. The outermost conductive via portion 700 includes an outermost signal conductive pad 710 and an outermost conductive body 720. The outermost conductive body 720 is disposed in the penetrating hole 410 of the outermost substrate layer 400. The outermost conductive body 720 is coaxial with a longitudinal axis (i.e., dotted line A) of the first conductive body 550 and the second conductive body 613, and the outermost conductive body 720 is electrically connected to the first conductive body 550 and the second conductive body 613. The outermost signal conductive pad 710 is embedded in one surface of the outermost substrate layer 400 opposite to the first substrate layer 200. Since the outermost conductive via portion 700 is structurally similar to the first conductive via portion 500 and the second conductive via portion 601, the specified details of the outermost conductive via portion 700 are not repeated herein.

Figure 9A:
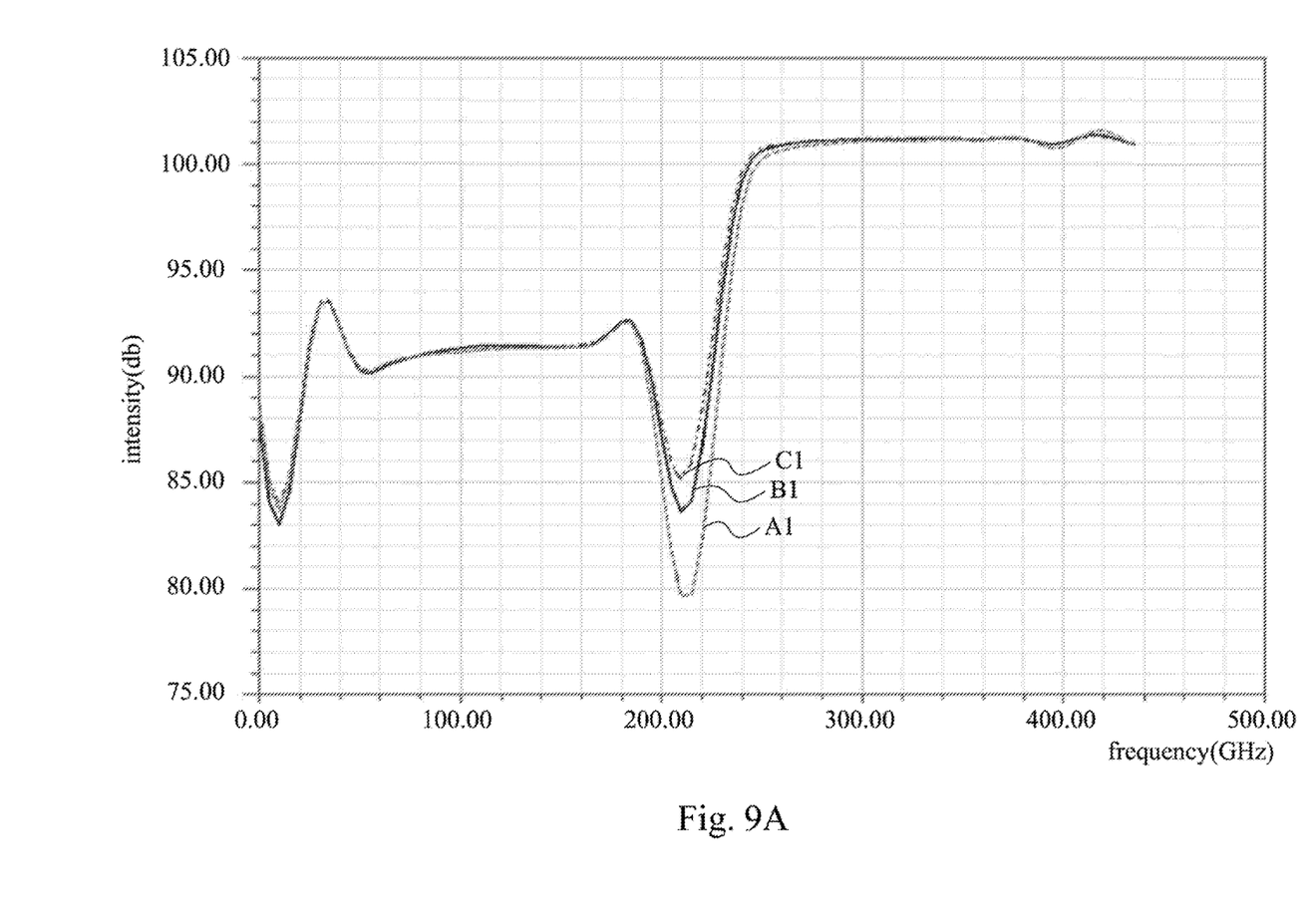
FIG. 9A is a waveform chart showing results obtained by performing Time Domain Reflectometry (TDR) Measurement on the multilayer laminated substrate structure of the fourth embodiment of the disclosure.

FIG. 9A is a waveform chart showing results obtained by performing Time Domain Reflectometry (TDR) Measurement on the multilayer laminated substrate structure of the fourth embodiment of the disclosure. As shown in FIG. 9A, a curve A1 shows impedance changes when a conventional conductive via portion having a fully circular signal conductive pad thereof is tested by TDR Measurement; a curve B1 shows impedance changes when the multilayer laminated substrate structure of the fourth embodiment is tested by TDR Measurement; and a curve C1 shows impedance changes when a hypothetical idle conductive via portion having no such signal conductive pad is tested by TDR Measurement.

At the same band segment of the frequency shown in FIG. 9A, referring to the curve A1 of FIG. 9A, the conventional conductive via portion at least generates impedance values of 79Ω-80Ω; referring to the curve B1 of FIG. 9A, the conductive via portion of the fourth embodiment generates impedance values of 83Ω-84Ω; and referring to the curve C1 of FIG. 9A, although the idle conductive via portion generates impedance values of 85Ω-86Ω, yet it is noted that, because not having such signal conductive pad, the hypothetical idle conductive via portion is difficult to be practically used due to difficulties of electrical conductivity and mass production.

Thus, as shown in FIG. 9A, the impedance values generated by the conductive via portion of the fourth embodiment is greater than the impedance values generated by the conventional conductive via portion. Since the impedance values is inversely proportional to parasitic capacitance, it is proved that the parasitic capacitance generated by the conductive via portion of the fourth embodiment is smaller than the parasitic capacitance generated by the conventional conductive via portion. Therefore, it means that the conductive via portion having the radiating pattern of the embodiment surely can decrease the parasitic capacitance resulted between two opposite signal conductive pads, so as to avoid decreasing the impedance value, transmission speed and filtering performance of the multilayer laminated substrate structure, and to maintain the electricity performance of the first conductive via portion.

Figure 9B:
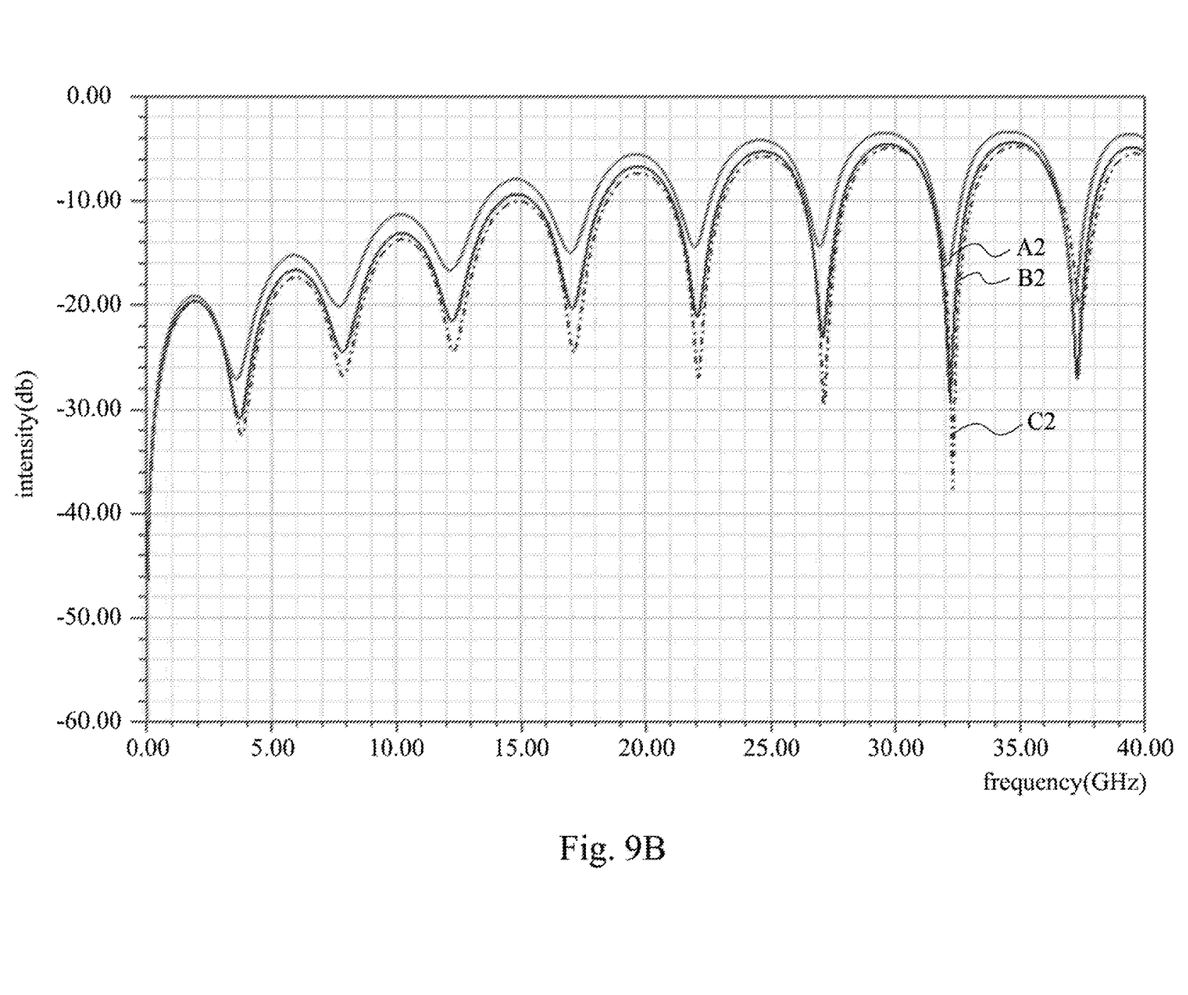
FIG. 9B is a waveform chart showing results obtained by performing Differential Return Loss (DRL) Measurement on the multilayer laminated substrate structure of the fourth embodiment of the disclosure.

FIG. 9B is a waveform chart showing results obtained by performing Differential Return Loss (DRL) Measurement on the multilayer laminated substrate structure of the fourth embodiment of the disclosure. As shown in FIG. 9B, a curve A2 shows changes of loss when a conventional conductive via portion having a fully circular signal conductive pad thereof is tested by DRL Measurement; a curve B2 shows changes of loss when the multilayer laminated substrate structure 101 of the fourth embodiment is tested by DRL Measurement; and a curve C2 shows changes of loss when a hypothetical idle conductive via portion having no such signal conductive pad is tested by DRL Measurement.

Since the differential return loss shown in FIG. 9B is a negative value which is more desirable with a greater absolute value of the negative value, referring to the curve A2 and curve B2 of FIG. 9B, the loss value of the multilayer laminated substrate structure of the fourth embodiment is better than the loss value of the conventional conductive via portion regardless of being operated under low-frequency or high-frequency environment. More particularly, when the multilayer laminated substrate structure operates under a high-frequency (35-40 GHz) environment, referring to the curve C2 and the curve B2 of FIG. 9B, the loss value of the multilayer laminated substrate structure of the fourth embodiment even is better than the loss value of the hypothetical idle conductive via portion.

Figure 9C:
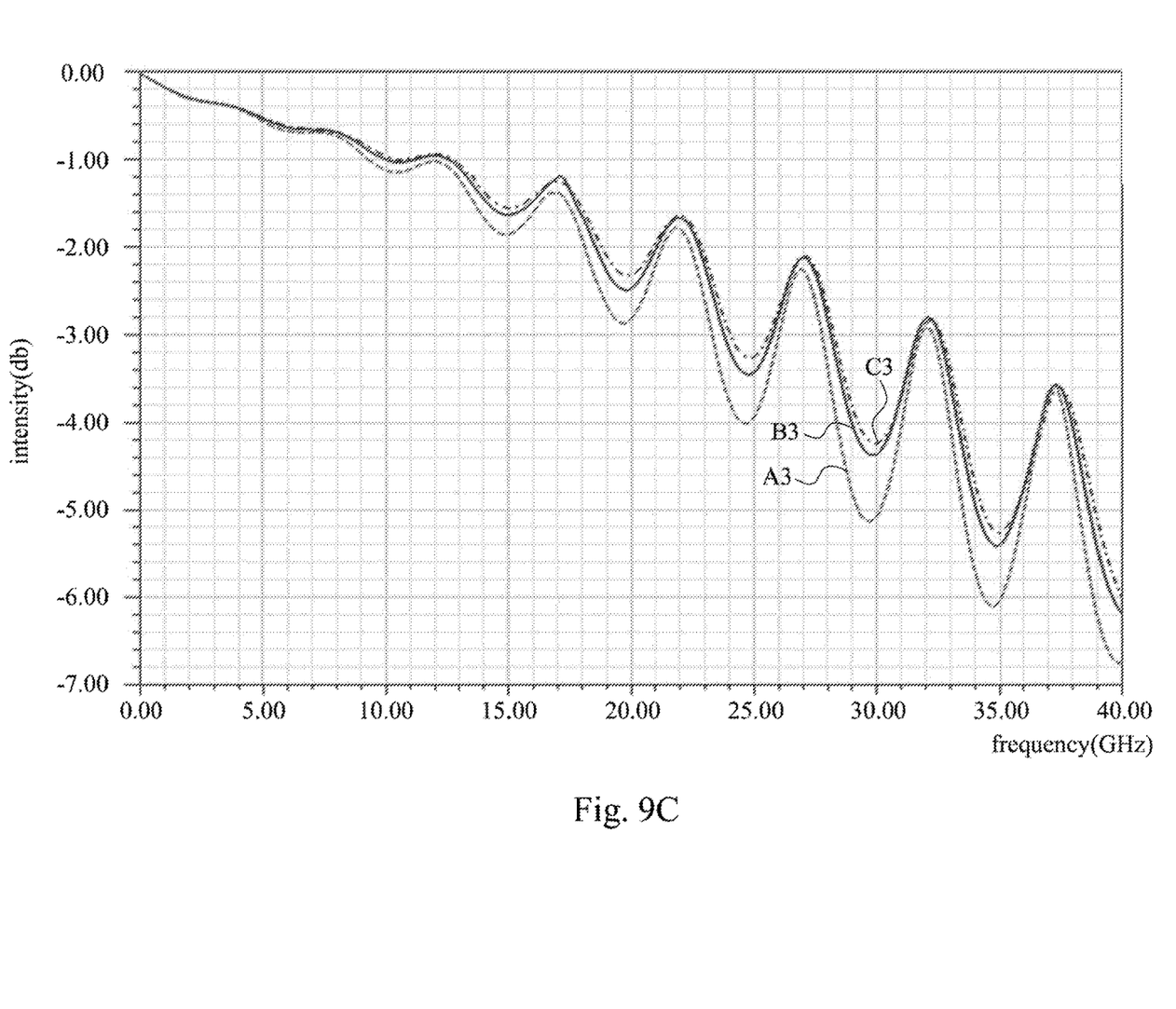
FIG. 9C is a waveform chart showing results obtained by performing Differential Insertion Loss (DIL) Measurement on the multilayer laminated substrate structure of the fourth embodiment of the disclosure.

FIG. 9C is a waveform chart showing results obtained by performing Differential Insertion Loss (DIL) Measurement on the multilayer laminated substrate structure of the fourth embodiment of the disclosure. As shown in FIG. 9C, a curve A3 shows changes of loss when a conventional conductive via portion having a fully circular signal conductive pad thereof is tested by DIL Measurement; a curve B3 shows changes of loss when the multilayer laminated substrate structure 101 of the fourth embodiment is tested by DIL Measurement; and a curve C3 shows changes of loss when a hypothetical idle conductive via portion having no such signal conductive pad is tested by DIL Measurement.

Since the differential return loss of FIG. 9C is a negative value which is more desirable with a smaller absolute value of the negative value, referring to the curve A3 and the curve B3 of FIG. 9C, the loss value of the multilayer laminated substrate structure of the fourth embodiment is better than the loss value of the conventional conductive via portion regardless of being operated under low-frequency or high-frequency environment. Referring to the curve C3 and the curve B3 of FIG. 9C, although the loss value of the idle conductive via portion is better than the loss value of the multilayer laminated substrate structure of the fourth embodiment, yet it is noted that, because not having such signal conductive pad, the hypothetical idle conductive via portion is difficult to be practically used due to difficulties of electrical conductivity and mass production.

Fifth Embodiment

Figure 10:
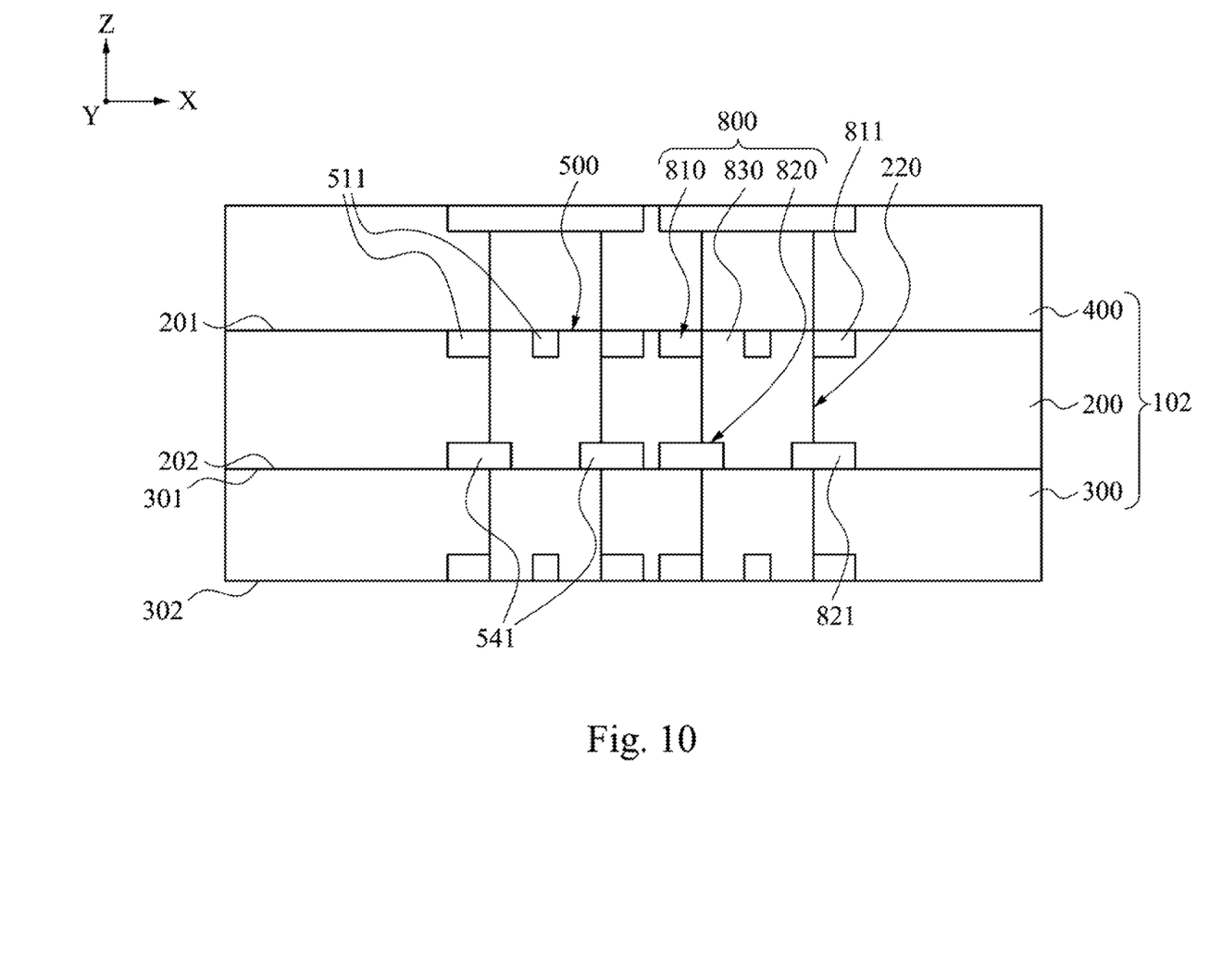
FIG. 10 is a cross-sectional view of a multilayer laminated substrate structure according to a fifth embodiment of this disclosure in which the cutting position of FIG. 10 is the same as the cutting position of FIG. 2.
Figure 11:
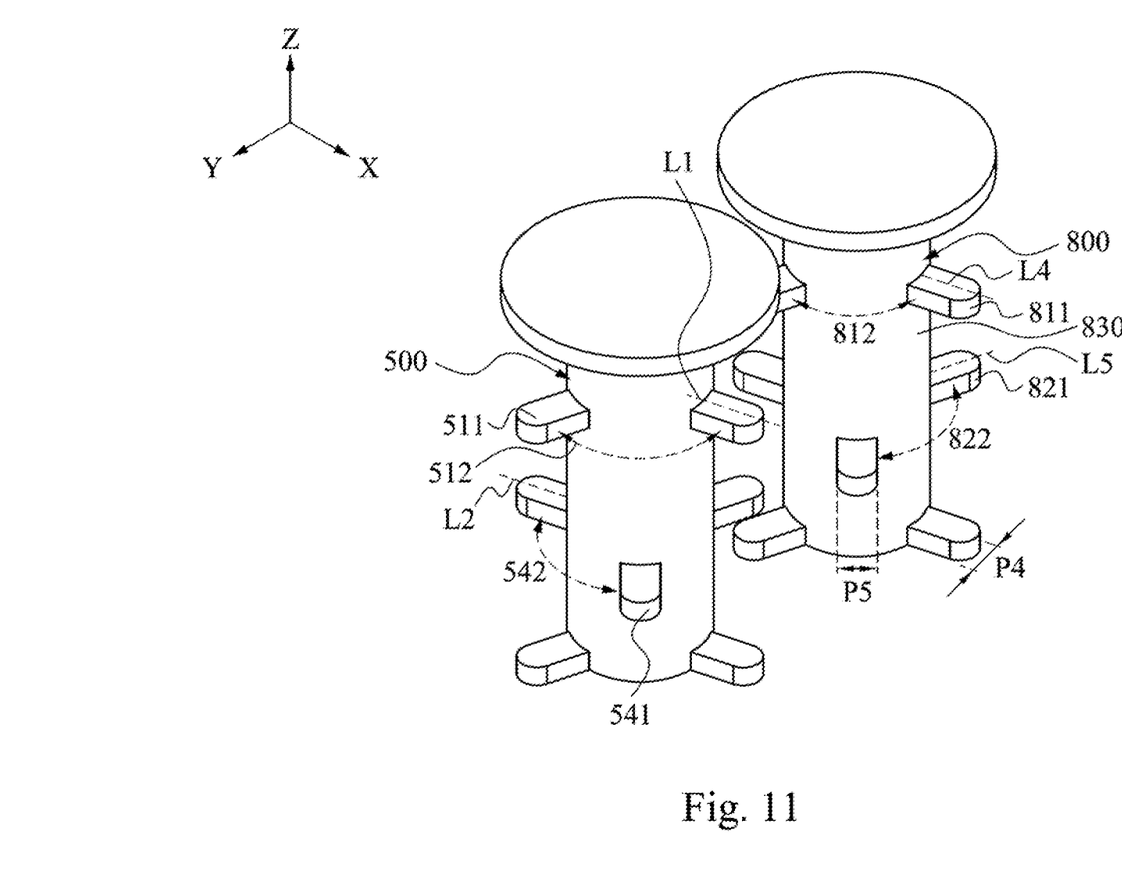
FIG. 11 is a perspective view of the first conductive via portion to the third conductive via portion according to the fifth embodiment of the disclosure.

Reference is now made to FIG. 10 and FIG. 11, in which FIG. 10 is a cross-sectional view of a multilayer laminated substrate structure 102 according to a fifth embodiment of this disclosure in which the cutting position of FIG. 10 is the same as the cutting position of FIG. 2, and FIG. 11 is a perspective view of the first conductive via portion 500 to the third conductive via portion 800 according to the fifth embodiment of the disclosure. As shown in FIG. 10 and FIG. 11, the multilayer laminated substrate structure 102 of the fifth embodiment is substantially the same as the multilayer laminated substrate structure 101 of the fourth embodiment, except that the first substrate layer 200 is further provided with a third through hole 220. The third through hole 220 penetrates through the first substrate layer 200 in a vertical direction thereof and connects the first surface 201 and the second surface 202. The multilayer laminated substrate structure 102 is further provided with a third conductive via portion 800. The third conductive via portion 800 is formed on the first substrate layer 200, and is disposed in the third through hole 220. The third conductive via portion 800 and the first conductive via portion 500 are arranged abreast on the first substrate layer 200.

The third conductive via portion 800 includes a fourth signal conductive pad 810, a fifth signal conductive pad 820 and a third conductive body 830. The fourth signal conductive pad 810 is formed on the first surface 201 of the first substrate layer 200. The fifth signal conductive pad is formed on the second surface 202 of the first substrate layer 200, and is disposed between the first substrate layer 200 and the second substrate layer 300. The fourth signal conductive pad 810 includes plural fourth ribs 811, and the shapes and the sizes of the fourth ribs 811 are the same. A fourth gap 812 is formed between any two neighboring ones of the fourth ribs 811. The fifth signal conductive pad 820 includes plural fifth ribs 821, and the shapes and the sizes of the fifth ribs 821 are the same. A fifth gap 822 is formed between any two neighboring ones of the fifth ribs 821. However, the shapes and the sizes of the fourth ribs (or the fifth ribs) do not have to be the same in the disclosure.

The third conductive body 830 is disposed in the third through hole 220, and is respectively connected to the fourth ribs 811 and the fifth ribs 821. The fourth ribs 811 and the fifth ribs 821 disposed on two opposite ends of the third conductive body 830 respectively extend radially outwardly. Since the fourth ribs 811 and the fifth ribs 821 are respectively radially arranged, the third conductive body 830 and the fourth ribs 811 are mutually formed in a radial pattern, and the third conductive body 830 and the fifth ribs 821 are mutually in formed another radial pattern.

It is noted that, each of the fourth ribs 811 and each of the first ribs 511 are not directly pointed to each other, that is, a longitudinal axis L4 of each of the fourth ribs 811 is different from a longitudinal axis L1 of each of the first ribs 511, or any one of the fourth ribs 811 is directly pointed to one of the first gaps 512 formed between two neighboring ones of the first ribs 511. For example, a longitudinal axis L4 of each of the fourth ribs 811 passes through one of the first gaps 512 formed between two neighboring ones of the first ribs 511. Similarly, each of the fifth ribs 821 and each of the second ribs 541 are not directly pointed to each other, that is, a longitudinal axis L5 of each of the fifth ribs 821 is different from a longitudinal axis L2 of each of the second ribs 541, or any one of the fifth ribs 821 is directly pointed to one of the second gaps 542 formed between two neighboring ones of the second ribs 541. For example, a longitudinal axis L5 of each of the fifth ribs 821 passes through one of the second gaps 542 formed between two neighboring ones of the second ribs 541.

Therefore, since the fourth ribs 811 of the third conductive via portion 800 and the first ribs 511 of the first conductive via portion 500 are arranged in a staggered manner in relation to each other, and are not horizontally (in the same X or Y axis) aligned exactly with each other, the shortest distance between the fourth ribs 811 and the first rib 511 is increased so that the possibility of the parasitic capacitance effect between the fourth ribs 811 and the first rib 511 can be reduced. Similarly, since the fifth ribs 821 of the third conductive via portion 800 and the second ribs 541 of the first conductive via portion 500 are arranged in a staggered manner in relation to each other, the shortest distance between the fifth ribs 821 and the second ribs 541 is increased so that the possibility of the parasitic capacitance effect between the fifth ribs 821 and the second ribs 541 can be reduced. Therefore, in the embodiment, the multilayer laminated substrate structure 102 is able to avoid decreasing the impedance value, transmission speed and filtering performance thereof, and is able to maintain the electricity performance of the first conductive via portion 500 and the third conductive via portion 800.

Also, the fourth ribs 811 and the fifth ribs 821 are arranged in a staggered manner in relation to each other, and the fourth ribs 811 and the fifth ribs 821 are not overlapped with each other vertically (in the same Z axis). For example, the fourth ribs 811 and the fifth ribs 821 are arranged in a staggered manner in relation to each other, an orthographic projection P4 of each of the fourth ribs 811 which is projected onto one plane and an orthographic projection P5 of each of the fifth ribs 821 which is projected onto the same plane are arranged in a staggered arrangement in relation to each other. Namely, each of the fourth ribs 811 shown in FIG. 11 is in any two neighboring ones of the fifth ribs 821. For example, the orthographic projection P4 of each of the fourth ribs 811 which is projected onto the third surface 301 of the second substrate layer 300 is in any two neighboring ones of the fifth ribs 821.

In the aforementioned embodiments, the multilayer laminated substrate structure is a circuit board device. However, the disclosure is not limited thereto, and in other embodiments, the multilayer laminated substrate structure also may be a package structure device or an integrated circuit. The multilayer laminated substrate structure is not limited to a low-frequency or high-frequency product. The person having ordinary skill in the art may flexibly select a type of the multilayer laminated substrate structure according to actual requirements.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A multilayer laminated substrate structure, comprising:
   a first substrate layer having a first through hole penetrating through the first substrate layer;
   a second substrate layer stacked on the first substrate layer; and
   a first conductive via portion, comprising:
      a first signal conductive pad which is formed on one surface of the first substrate layer and comprises a plurality of first ribs, a first gap is formed between any two neighboring ones of the first ribs;
      a second signal conductive pad which is formed on another surface of the first substrate layer and comprises at least one second rib, wherein an orthographic projection of the second rib onto the one surface of the first substrate lever is located within one of the first gaps; and
      a first conductive body which is disposed in the first through hole and is respectively connected to the first rib and the second rib, wherein the first rib and the second rib are arranged in a staggered manner in relation to each other.

2. The multilayer laminated substrate structure of claim 1, wherein a number of the at least one second rib is plural, and a second gap is formed between any two neighboring ones of the second ribs,
   wherein one of the first gaps and one of the second gaps are the same in size.

3. The multilayer laminated substrate structure of claim 1, wherein a number of the at least one second rib is plural, and the first ribs and the second ribs are different in number.

4. The multilayer laminated substrate structure of claim 1, wherein the first ribs radially and equidistantly surround the first conductive via portion.

5. The multilayer laminated substrate structure of claim 1, wherein a number of the at least one second rib is plural, and the second ribs radially and equidistantly surround the first conductive via portion.

6. The multilayer laminated substrate structure of claim 1, wherein when a number of the at least one second rib is one, a longitudinal axis of the first rib is parallel to a longitudinal axis of the second rib.

7. The multilayer laminated substrate structure of claim 1, wherein the second substrate layer has a second through hole, wherein the second signal conductive pad is connected to one surface of the second substrate layer, and is arranged between the first substrate layer and the second substrate layer; and
   the multilayer laminated substrate structure further comprises a second conductive via portion, wherein the second conductive via portion is disposed in the second through hole, the second conductive via portion comprising:
   a third signal conductive pad formed on another surface of the second substrate layer, the third signal conductive pad comprising at least one third rib; and
   a second conductive body disposed in the second through hole, wherein the second conductive body is respectively connected to the second rib and the third rib and is coaxial with a longitudinal axis of the first conductive body, wherein an orthographic projection of the third rib onto the first substrate layer and an orthographic projection of the second rib onto the first substrate layer are arranged in a staggered manner in relation to each other.

8. The multilayer laminated substrate structure of claim 7, wherein a number of the at least one third rib is plural, and a gap is formed between any two neighboring ones of the third ribs,
wherein an orthographic projection of the second rib onto the another surface of the second substrate layer is in the gap formed between the two neighboring ones of the third ribs.

9. The multilayer laminated substrate structure of claim 7, wherein a number of the at least one second rib is plural, and a number of the at least one third rib is plural, and a second gap is formed between any two neighboring ones of the second ribs, and a third gap is formed between any two neighboring ones of the third ribs, wherein the second gap and the third gap are the same in size.

10. The multilayer laminated substrate structure of claim 7, wherein a number of the at least one second rib is plural, and a number of the at least one third rib is plural, and the second ribs and the third ribs are different in number.

11. The multilayer laminated substrate structure of claim 7, wherein a number of the at least one second rib is plural, and a number of the at least one third rib is plural, and the third ribs radially and equidistantly surround the second conductive via portion, and the second ribs radially and equidistantly surround the second conductive via portion.

12. The multilayer laminated substrate structure of claim 7, wherein one of the first ribs and the third rib are overlapped or staggered with each other.

13. The multilayer laminated substrate structure of claim 1, further comprising a third conductive via portion, wherein the third conductive via portion and the first conductive via portion are arranged abreast on the first substrate layer, and the third conductive via portion comprises:
 a fourth signal conductive pad which is formed on the one surface of the first substrate layer and comprises at least one fourth rib, wherein a longitudinal axis of the fourth rib is different from a longitudinal axis of the first rib;
 a fifth signal conductive pad formed on the another surface of the first substrate layer, and comprising at least one fifth rib, a longitudinal axis of the fifth rib is different from a longitudinal axis of the second rib; and
 a third conductive body penetrating through the first substrate layer, wherein the third conductive body is parallel to the first conductive body and is respectively connected to the fourth rib and the fifth rib, and the fourth rib and the fifth rib are arranged in a staggered manner in relation to each other.

14. The multilayer laminated substrate structure of claim 1, wherein the first substrate layer is an outermost layer or an intermediate layer of the multilayer laminated substrate structure.

15. The multilayer laminated substrate structure of claim 1, wherein the multilayer laminated substrate structure is a package structure device or a circuit board device.

16. A multilayer laminated substrate structure, comprising:
 a plurality of substrate layers stacked with each other; and
 a conductive via portion penetrating through one of the substrate layers, the conductive via portion comprising:
 a first radiating pattern formed on one surface of the substrate layer, the first radiating pattern having a plurality of first ribs which are radially arranged; and
 a second radiating pattern formed on another surface of the substrate layer, the second radiating pattern having a plurality of second ribs which are radially arranged,
 wherein an orthographic projection of the second rib onto another of the substrate layers and an orthographic projection of the first rib onto the another of the substrate layers are arranged in a staggered manner in relation to each other.

17. A multilayer laminated substrate structure, comprising:
 a plurality of substrate layers stacked with each other,
 a first conductive via portion penetrating through one of the substrate layers, the first conductive via portion comprising a first radiating pattern formed on one surface of the substrate layer, the first radiating pattern having a plurality of first ribs which are radially arranged; and
 a third conductive via portion penetrating through the substrate layer in which the first conductive via portion is disposed, wherein the third conductive via portion and the first conductive via portion are adjacent and arranged abreast, the third conductive via portion comprising a third radiating pattern formed on the surface of the substrate layer, the third radiating pattern having a plurality of third ribs which are radially arranged,
 wherein a longitudinal axis of one of the first ribs passes through a gap formed between two neighboring ones of the third ribs.

* * * * *